(12) United States Patent
Malatkar et al.

(10) Patent No.: US 9,159,649 B2
(45) Date of Patent: Oct. 13, 2015

(54) MICROELECTRONIC PACKAGE AND STACKED MICROELECTRONIC ASSEMBLY AND COMPUTING SYSTEM CONTAINING SAME

(75) Inventors: Pramod Malatkar, Chandler, AZ (US); Drew W. Delaney, Chandler, AZ (US); Rahul N. Manepalli, Chandler, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 13/976,102

(22) PCT Filed: Dec. 20, 2011

(86) PCT No.: PCT/US2011/066049
§ 371 (c)(1),
(2), (4) Date: Jun. 26, 2013

(87) PCT Pub. No.: WO2013/095363
PCT Pub. Date: Jun. 27, 2013

(65) Prior Publication Data
US 2013/0270719 A1    Oct. 17, 2013

(51) Int. Cl.
*H01L 23/48*    (2006.01)
*H01L 23/498*   (2006.01)
*H01L 25/10*    (2006.01)

(52) U.S. Cl.
CPC .......... *H01L 23/48* (2013.01); *H01L 23/49816* (2013.01); *H01L 23/49894* (2013.01);
(Continued)

(58) Field of Classification Search
CPC ............... H01L 23/49894; H01L 2224/16225; H01L 2225/1023
USPC ............... 257/700, 701, 734, 777; 174/258; 438/106
See application file for complete search history.

(56) References Cited

U.S. PATENT DOCUMENTS

| 5,641,997 A * | 6/1997 | Ohta et al. ..................... 257/788 |
| 5,880,530 A * | 3/1999 | Mashimoto et al. .......... 257/783 |

(Continued)

FOREIGN PATENT DOCUMENTS

WO    2013/095363 A1    6/2013

OTHER PUBLICATIONS

International Search Report and Written Opinion received for International Application No. PCT/US2011/066049, mailed on Sep. 24, 2012, 11 pages.

(Continued)

*Primary Examiner* — Fernando L Toledo
*Assistant Examiner* — Victoria K Hall
(74) *Attorney, Agent, or Firm* — Kenneth A. Nelson

(57) ABSTRACT

A microelectronic package comprises a die (110, 210) and a plurality of electrically conductive layers (120, 220) and electrically insulating layers (130, 230), including a first electrically insulating layer (131, 231) closer to the die than any other electrically insulating layer) and second (132, 232) and third electrically insulating layers (233). Each electrically insulating layer has a corresponding glass transition temperature, coefficient of thermal expansion, and modulus of elasticity. The modulus of elasticity of the second electrically insulating layer is greater than that for the first electrically insulating layer, while $CTE_1$ for the second electrically insulating layer is greater than $CTE_1$ for the first. $CTE_2$ for the third electrically insulating layer is less than $CTE_2$ for the first electrically insulating layer. In an embodiment an electrically insulating layer is a glass cloth layer (140) that is an outermost layer of the microelectronic package.

15 Claims, 4 Drawing Sheets

(52) U.S. Cl.
CPC ..... *H01L25/105* (2013.01); *H01L 2224/16225* (2013.01); *H01L 2225/1023* (2013.01); *H01L 2225/1058* (2013.01); *H01L 2225/1088* (2013.01); *H01L 2924/01327* (2013.01)

(56) References Cited

U.S. PATENT DOCUMENTS

| | | | | |
|---|---|---|---|---|
| 5,990,545 | A * | 11/1999 | Schueller et al. | 257/697 |
| 6,049,038 | A * | 4/2000 | Suzuki | 174/539 |
| 6,223,429 | B1 * | 5/2001 | Kaneda et al. | 29/832 |
| 6,426,566 | B1 * | 7/2002 | Sawamoto | 257/783 |
| 6,600,234 | B2 * | 7/2003 | Kuwabara et al. | 257/790 |
| 6,674,172 | B2 * | 1/2004 | Vincent | 257/777 |
| 7,057,283 | B2 * | 6/2006 | Inoue et al. | 257/737 |
| 7,078,807 | B2 * | 7/2006 | Honda et al. | 257/734 |
| 7,253,091 | B2 * | 8/2007 | Brewer et al. | 438/618 |
| 7,335,608 | B2 * | 2/2008 | Tanikella | 438/780 |
| 7,745,264 | B2 * | 6/2010 | Zhai et al. | 438/127 |
| 8,212,365 | B2 * | 7/2012 | Sunohara et al. | 257/778 |
| 8,450,852 | B2 * | 5/2013 | Kondo et al. | 257/758 |
| 8,730,676 | B2 * | 5/2014 | Hirsch et al. | 361/716 |
| 2002/0096759 | A1 * | 7/2002 | Hirano et al. | 257/706 |
| 2004/0087058 | A1 * | 5/2004 | Ooi et al. | 438/106 |
| 2004/0089470 | A1 | 5/2004 | Shimoto et al. | |
| 2004/0107569 | A1 | 6/2004 | Guzek et al. | |
| 2005/0252682 | A1 * | 11/2005 | Shimoto et al. | 174/260 |
| 2006/0017154 | A1 * | 1/2006 | Eguchi et al. | 257/701 |
| 2006/0060956 | A1 * | 3/2006 | Tanikella | 257/686 |
| 2006/0071345 | A1 * | 4/2006 | Chiu et al. | 257/777 |
| 2007/0013049 | A1 * | 1/2007 | Asai et al. | 257/700 |
| 2007/0085203 | A1 * | 4/2007 | Kariya et al. | 257/734 |
| 2007/0238220 | A1 * | 10/2007 | Lii et al. | 438/106 |
| 2008/0176471 | A1 * | 7/2008 | Ogihara et al. | 442/203 |
| 2009/0151989 | A1 * | 6/2009 | Hunrath | 174/257 |
| 2009/0155552 | A1 * | 6/2009 | Blackshear et al. | 428/209 |
| 2010/0025093 | A1 * | 2/2010 | Maruyama et al. | 174/258 |
| 2010/0032826 | A1 * | 2/2010 | Tachibana et al. | 257/692 |
| 2010/0084175 | A1 * | 4/2010 | Suzuki et al. | 174/260 |
| 2011/0024898 | A1 * | 2/2011 | Leung et al. | 257/734 |
| 2011/0078895 | A1 * | 4/2011 | Suwada | 29/593 |
| 2011/0227214 | A1 * | 9/2011 | Tateiwa et al. | 257/734 |
| 2011/0241186 | A1 | 10/2011 | Nalla et al. | |
| 2012/0024582 | A1 * | 2/2012 | Maeda et al. | 174/258 |

OTHER PUBLICATIONS

International Preliminary Report on Patentability received for International Application No. PCT/US2011/066049, mailed on Jul. 3, 2014, 8 pages.

* cited by examiner

MICROELECTRONIC PACKAGE AND STACKED MICROELECTRONIC ASSEMBLY AND COMPUTING SYSTEM CONTAINING SAME

FIELD OF THE INVENTION

The disclosed embodiments of the invention relate generally to packaging for microelectronic devices, and relate more particularly to warpage reduction in such packages.

BACKGROUND OF THE INVENTION

Microelectronic device packaging typically contains multiple materials, each with its own coefficient of thermal expansion (CTE). Any system characterized by disparate CTEs is at risk for warpage problems, and, because of their aggressive size scaling, microelectronic packages are perhaps especially vulnerable in this area. Various techniques are currently used to overcome or at least mitigate warpage problems in microelectronics packaging. While many of these have been at least somewhat successful, new approaches are needed in order to more fully address warpage issues.

BRIEF DESCRIPTION OF THE DRAWINGS

The disclosed embodiments will be better understood from a reading of the following detailed description, taken in conjunction with the accompanying figures in the drawings in which.

Figure 1:
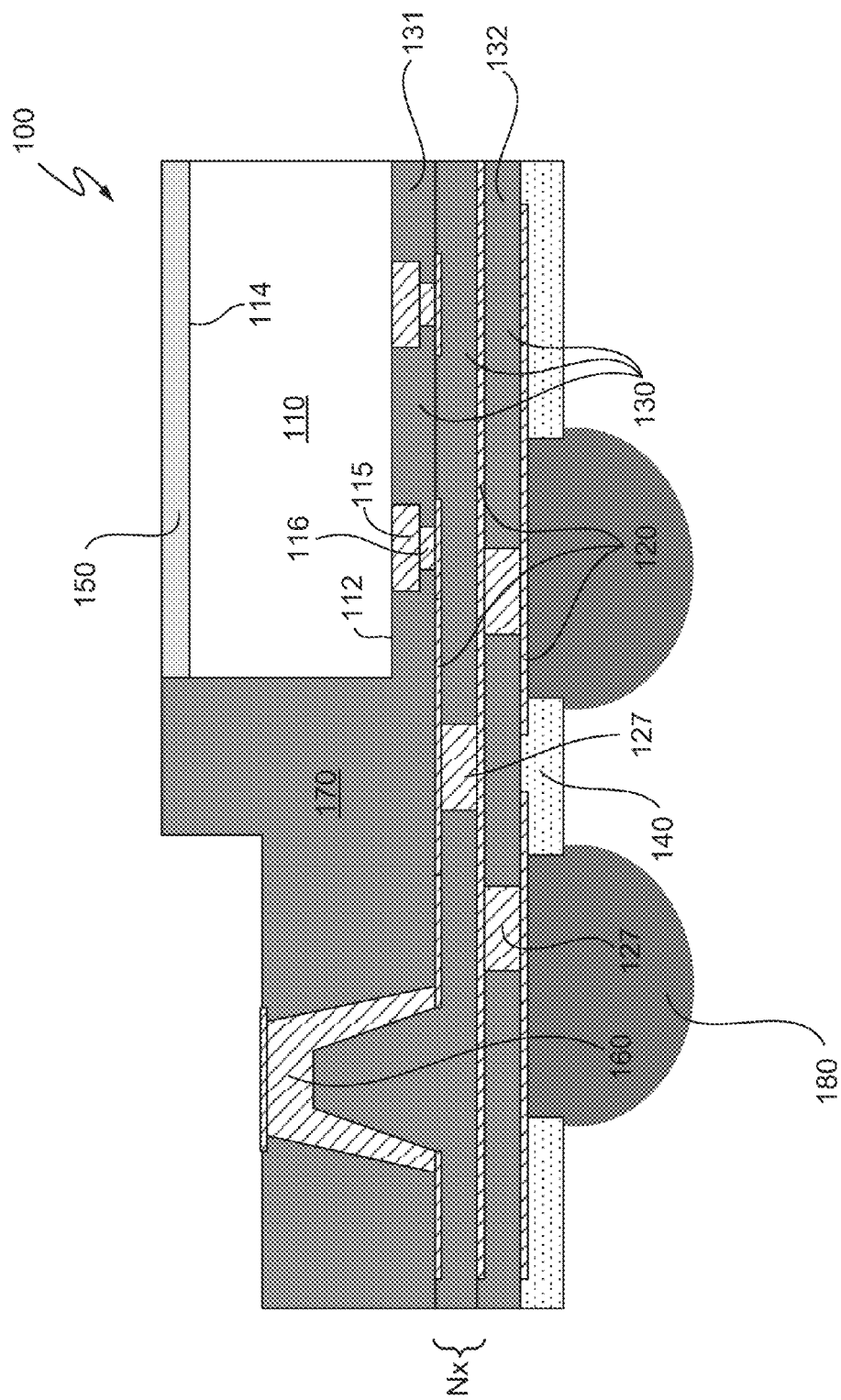
FIG. 1 is a cross-sectional view of a microelectronic package according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. Certain figures may be shown in an idealized fashion in order to aid understanding, such as when structures are shown having straight lines, sharp angles, and/or parallel planes or the like that under real-world conditions would likely be significantly less symmetric and orderly. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions unless otherwise indicated either specifically or by context. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

Strong demand for small form factor products (phones, tablets, netbooks, notebooks, etc.) has spurred the development of thin-core packages and of coreless packages such as coreless bumpless build-up layer (BBUL-C) packaging. These thin packages are at significant risk for warpage and therefore need to be strengthened—both at room (operational) temperature (about 25° C.) and, during manufacturing, at elevated (reflow) temperatures (about 260° C.)—in order to mitigate that risk. Embodiments of the invention make use of different optimized materials to reduce warpage at room and elevated temperatures while maintaining or improving upon currently-achievable package thickness values.

Referring now to the drawings, FIG. 1 is a cross-sectional view of a microelectronic package 100 according to an embodiment of the invention. As illustrated in FIG. 1, microelectronic package 100 comprises a microelectronic die 110, a plurality of electrically conductive layers 120 adjacent to the die, and a plurality of electrically insulating layers 130 adjacent to the die and arranged in roughly alternating relationship with the electrically conductive layers, as shown. In certain embodiments these electrically conductive and electrically insulating layers can be build-up layers that are part of a BBUL or a BBUL-C package. Only a few such layers are illustrated, but it should be understood that embodiments may include additional layers similar to those that are shown in the figure (as suggested by the "Nx" designation, which means that the indicated layers—or similar layers—may be repeated N times in a particular microelectronic package). The electrically insulating layers may comprise dielectric layers, and the electrically conductive layers may take the form of electrically conductive traces formed adjacent to each dielectric layer, with conductive vias 127 extending through each dielectric layer to connect the conductive traces on different layers. Microelectronic package 100 further comprises solder balls 180 for connecting the package to a motherboard (not shown) or other next-level component.

Microelectronic die 110 may comprise any type of integrated circuit device. In one embodiment, die 110 includes a processing system (either single core or multi-core). For example, the die may comprise a microprocessor, a graphics processor, a signal processor, a network processor, a chipset, etc. In one embodiment, die 110 comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of IC devices.

Die 110 includes a front-side 112 and an opposing backside 114. In some embodiments, front-side 112 may be referred to as the "active surface" of the die. An electrical connection between die 110 and the underlying substrate is made using die bumps 115 and plated via interconnects 116 (Via0) that connect the die bumps to a first one of electrically conductive layers 120. Die bumps 115 and via interconnects 116 may comprise any type of structure and materials (e.g., copper) capable of providing electrical communication between die 110 and the substrate, and, according to the illustrated embodiment, the dielectric and metal build-up layers that form the substrate may be built up directly over die 110, in which case a dielectric and subsequent metal layer may be formed directly on front-side 112 of die 110, with the metal layer forming electrical contact with one or more bond pads on the die. In such an embodiment, discrete interconnects may not be necessary, as metallization in the substrate may directly contact a die bond pad. Examples of processes that may utilize the aforementioned technique include BBUL, die-embedding, and wafer-level packaging.

In other (non-illustrated) embodiments, alternative structures and/or methods may be utilized to couple die 110 with the substrate. For example, die 110 may be disposed on the substrate in a flip-chip arrangement in which interconnects comprise an electrically conductive terminal on the die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures). Solder (e.g., in the form of balls or bumps) may be disposed on the terminals of the substrate and/or die, and these terminals may then be joined using a solder reflow process. Of course, it should be understood that, in other embodiments, many other types of interconnects and materials are possible (e.g., wirebonds extending between the die 110 and the substrate). The terminals on die 110 may comprise any suitable material or any suitable combination of materials, whether disposed in multiple layers or combined to form one or more alloys and/or one or more intermetallic compounds. For example, the terminals on die 110 may include copper, aluminum, gold, silver, nickel, titanium, tungsten, as well as any combination of these and/or other metals. In other embodiments, a terminal may comprise one or more non-metallic materials (e.g., a conductive polymer). The terminals on the substrate may also comprise any suitable material or any suitable combination of materials, whether disposed in multiple layers or combined to form one or more alloys and/or one or more intermetallic compounds. For example, the terminals on the substrate may include copper, aluminum, gold, silver, nickel, titanium, tungsten, as well as any combination of these and/or other metals. Any suitable solder material may be used to join the mating terminals of the die 110 and the substrate, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter the reflow temperature).

One of electrically insulating layers 130 is an electrically insulating layer 131 that is closer to die 110 than any other electrically insulating layer in microelectronic package 100. Another one of the electrically insulating layers is an electrically insulating layer 132, to be further discussed below. Microelectronic package 100 further comprises a glass cloth layer 140—also an electrically insulating layer—that, as shown, constitutes an outermost layer of the microelectronic package. Also shown in FIG. 1 is a die backside film (DBF) 150, a package-on-package (PoP) pad and via 160, and an electrically insulating region 170 that, at least in some embodiments, is formed from—and may be an extension of—electrically insulating layer 131. In some embodiments electrically insulating region 170 may contain an encapsulation material that may be a silica-filled epoxy, such as build-up films available from Ajinomoto Fine-Techno Co., Inc. (hereinafter "Ajinomoto). 1-2 Suzuki-cho, Kawasaki-ku, Kawasaki-shi, 210-0801, Japan (e.g. Ajinomoto ABF-GX13, Ajinomoto GX92, and the like). Note that FIG. 1 shows only a portion of microelectronic package 100; additional structure constituting essentially a minor image of what is shown would typically be located on a side of die 110 opposite the side where PoP pad and via 160 are shown.

A glass cloth layer such as layer 140 is made up of glass fibers encapsulated in a dielectric material. Glass cloth is available—from a variety of vendors (including Ajinomoto)—in various thicknesses and compositions.

In many existing package configurations, one of electrically insulating layers 130 comprises glass cloth and the outermost package layer is occupied by solder resist. (Subsequent references herein to "existing package configurations" or "existing packages" or the like are references to a package fitting that description.) Placing the glass cloth in the outermost package layer instead (and in the process displacing and eliminating the solder resist), as in FIG. 1, results in a greater thermal moment that reduces package warpage. Because of the glass cloth layer's high modulus and low CTE at temperatures above its glass transition temperature, the glass cloth is especially effective in combating reflow temperature warpage.

Electrically conductive layers 120 and electrically insulating layers 130 are components of a substrate for microelectronic package 100. This substrate—sometimes referred to as a "package substrate"—may comprise any suitable type of substrate capable of providing electrical communications between die 110 and a next-level component to which microelectronic package 100 is coupled (e.g., a circuit board). In another embodiment, the package substrate may comprise any suitable type of substrate capable of providing electrical communication between die 110 and an upper package that may be coupled with microelectronic package 100, and in a further embodiment the package substrate may comprise any suitable type of substrate capable of providing electrical communication between such an upper package and a next-level component to which microelectronic package 100 is coupled. The package substrate may also provide structural support for die 110. By way of example, in one embodiment, the package substrate comprises a multi-layer substrate—including alternating layers of a dielectric material and metal—built up around a core layer (either a dielectric or metal core). In another embodiment, the substrate comprises a coreless multi-layer substrate. Other types of substrates and substrate materials may also find use with the disclosed embodiments (e.g., ceramics, sapphire, glass, etc.). In the illustrated embodiment, as has been mentioned, the substrate may comprise alternating layers of dielectric material and metal that are built-up over the die itself; this process is sometimes referred to as a "bumpless build-up process." Where such an approach is utilized, solder interconnects may not be needed and may be replaced by directly-plated copper via interconnects, as the build-up layers may be disposed directly over die 110.

Electrically insulating layer 132 is farther from die 110 than any other electrically insulating layer besides glass cloth layer 140. In one embodiment, electrically insulating layer 132 comprises a glass cloth layer having a thickness no greater than 75 micrometers (also referred to herein using the designations "microns" and "μm"). In another embodiment, electrically insulating layer 132 again comprises a glass cloth layer, this time having a thickness no greater than 55 microns. (In these embodiments, a solder resist layer may be substituted for glass cloth layer 140.) Modeling results indicate that a 55-μm glass cloth layer is more effective in reducing warpage than is a 75-μm glass cloth layer—likely due to the higher volume fraction of glass fibers compared to the surrounding dielectric material in the sheath used to contain the glass fibers. Increasingly smaller thicknesses are likely to be increasingly effective in this regard.

In yet another embodiment, electrically insulating layer 132 comprises a dielectric material (not necessarily a glass cloth layer) having a thickness no greater than 30 microns. This embodiment yields both warpage reduction benefits and overall package thickness benefits. Warpage is reduced, as explained above, due to the presence in the package of glass cloth layer 140—that is, of a glass cloth layer as the package's outermost layer. Overall package thickness is less than that of existing package configurations due to the presence in the inventive embodiment of a thin (e.g., 30 μm.) dielectric layer at a particular interior package location as opposed to the presence of a glass cloth at that location in the existing package.

It was mentioned above that embodiments of the invention feature a glass cloth layer (rather than the existing package's solder resist material) in the outermost package layer instead of in its more typical position as one of the package's interior electrically insulating layers (such as layers 130 in FIG. 1). Not stated in that earlier discussion is the fact mentioned immediately above, namely, that those inventive embodiments may have electrically insulating layers that are thinner than those of an existing package, thus providing an overall package thickness benefit. Also contributing to the thickness benefit is the fact that the outermost layer does not figure in the overall package thickness calculation, as the solder ball is attached to the last conduction layer which lies above the outermost layer.

Figure 2:
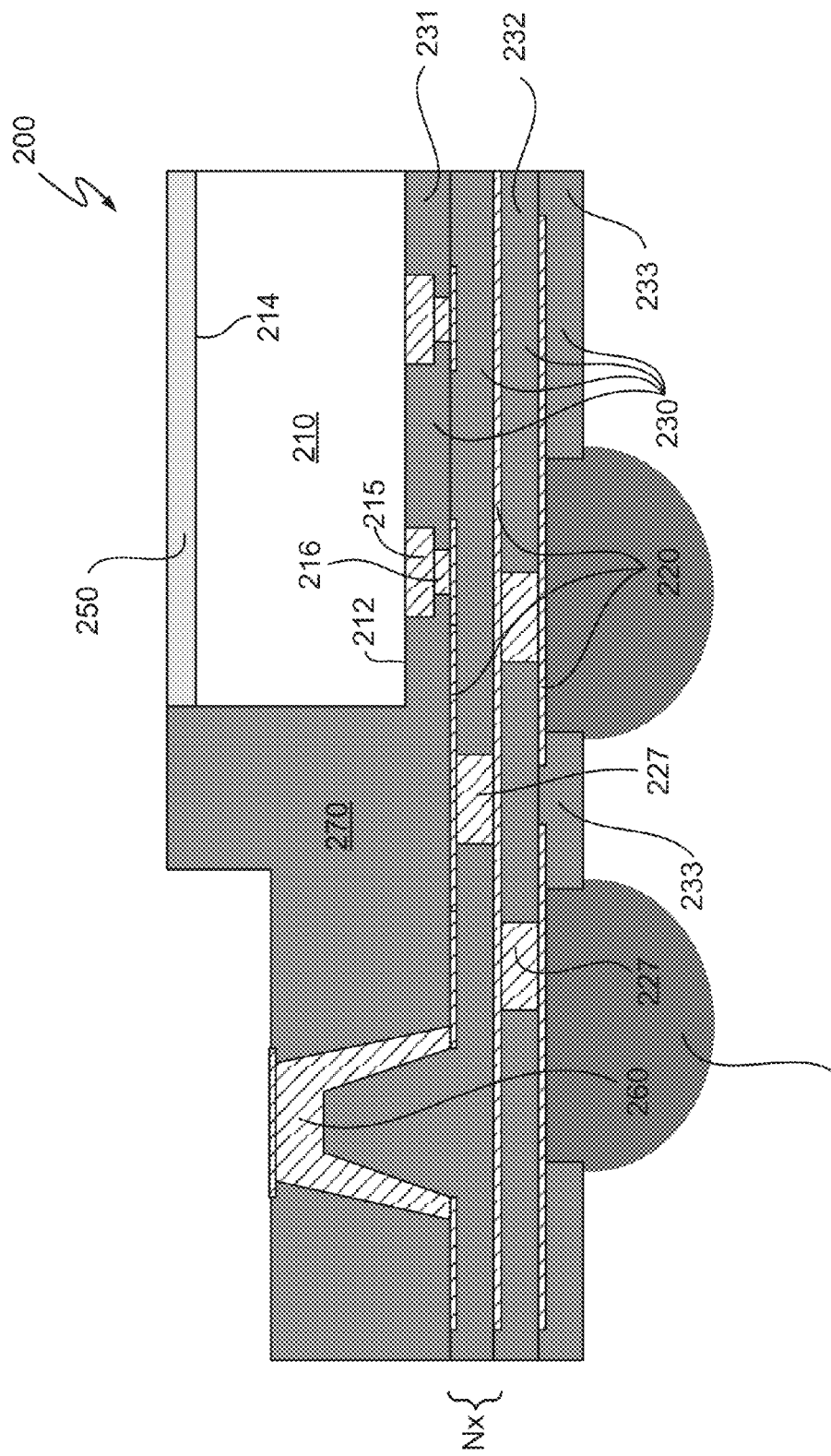
FIG. 2 is a cross-sectional view of a microelectronic package according to another embodiment of the invention.

FIG. 2 is a cross-sectional view of a microelectronic package 200 according to an embodiment of the invention. In many respects microelectronic package 200 is similar to microelectronic package 100 of FIG. 1, but there are certain distinctions between the two packages, as discussed below.

As illustrated in FIG. 2, microelectronic package 200 comprises a microelectronic die 210 (with a front side 212 and a backside 214), a plurality of electrically conductive layers 220 adjacent to the die, and a plurality of electrically insulating layers 230 adjacent to the die and arranged in roughly alternating relationship with the electrically conductive layers, as shown. Die bumps 215 and plated vias 216 extend from the die's front side 212 and electrically connect die 210 with the underlying substrate. Conductive vias 227 extend through each electrically insulating layer to connect the conductive traces on different layers. In certain embodiments these electrically conductive and electrically insulating layers can be build-up layers that are part of a BBUL or a BBUL-C package. Only a few such layers are illustrated, but it should be understood that embodiments may include additional layers similar to those that are shown in the figure (as suggested by the "Nx" designation, which means that the indicated layers—or similar layers—may be repeated N times in a particular microelectronic package).

One of electrically insulating layers 230 is an electrically insulating layer 231 that is closer to die 210 than any other electrically insulating layer in microelectronic package 200. Additional electrically insulating layers will be introduced and discussed below. Microelectronic package 200 further comprises a DBF 250 a PoP pad and via 260, an electrically insulating region 270 that, at least in some embodiments, is formed from—and may be an extension of—electrically insulating layer 231, and solder balls 280. Note that FIG. 2 shows only a portion of microelectronic package 200; additional structure constituting essentially a mirror image of what is shown would typically be located on a side of die 210 opposite the side where PoP pad and via 260 are shown.

Microelectronic package 200 further comprises electrically insulating layers 232 and 233. In the illustrated embodiment, electrically insulating layer 233 constitutes an outermost layer of microelectronic package 200, while electrically insulating layer 232 is farther from die 210 than any other electrically insulating layer besides electrically insulating layer 233. In other embodiments, at least one of which will be discussed in detail below, the locations of layers 232 and 233 may be reversed or otherwise altered.

Electrically insulating layer 231 has a first glass transition temperature, a first coefficient of thermal expansion, and a first modulus of elasticity. Electrically insulating layer 232 has a second glass transition temperature, a second coefficient of thermal expansion, and a second modulus of elasticity. Electrically insulating layer 233 has a third glass transition temperature, a third coefficient of thermal expansion, and a third modulus of elasticity. Each of these parameters may, according to embodiments of the invention, be chosen so as to have a beneficial effect on warpage reduction for microelectronic package 200, as detailed below.

In one embodiment, the second modulus of elasticity is greater than the first modulus of elasticity. This means that electrically insulating layer 232 is stiffer and more rigid than electrically insulating layer 231. By placing such a layer as far or nearly as far as possible from the die the shear-stress induced thermal moment can be increased, leading to warpage reduction.

In the same or another embodiment, the second coefficient of thermal expansion at a temperature less than the second glass transition temperature—i.e., at temperatures equal to or close to room temperature—is lower than the first coefficient of thermal expansion at a temperature lower than the first glass transition temperature. It will be convenient to use hereinafter the notation "$CTE_1$," to refer to the CTE of a material at a temperature below the material's glass transition temperature and the notation "$CTE_2$" to refer to the CTE of a material at a temperature above the material's glass transition temperature. Using this notation, the previous concept may be stated as follows: $CTE_1$ of electrically insulating layer 232 is lower than $CTE_1$ of electrically insulating layer 231. Furthermore, $CTE_2$ of electrically insulating layer 233 is less than $CTE_2$ of electrically insulating layer 231.

In an embodiment like that illustrated in FIG. 2, where electrically insulating layer 233 constitutes an outermost layer of microelectronic package 200 and electrically insulating layer 232 is farther from die 210 than all other insulating layers except for electrically insulating layer 233, both electrically insulating layer 232 and electrically insulating layer 233 can comprise a glass cloth material. In a different (non-illustrated) embodiment—where electrically insulating layer 232 constitutes an outermost layer of the microelectronic package and electrically insulating layer 233 is farther from the die than any other electrically insulating layer other than electrically insulating layer 232—electrically insulating layer 232 can comprise one of a glass cloth, including a particular glass cloth type that is formed from a cyanate-based resin, a mold compound, and a filled epoxy (e.g., a highly-filled epoxy such as epoxy filled with 90% silica), and electrically insulating layer 233 can comprise a glass cloth.

A glass cloth used as the outermost layer (or near outermost layer) is very effective in reducing warpage of a coreless package both at room and elevated (e.g., reflow) temperatures because of its high modulus and low $CTE_1$ & $CTE_2$. Additionally, the room temperature warpage can be reduced still further—even significantly reduced—by the use of a very-high modulus (higher than glass cloth), low $CTE_1$ (lower than glass cloth) material in one of the outermost package layers. In other words, by using two different optimized materials in specific locations, it is possible, according to embodiments of the invention, to effectively lower package warpage at both room and reflow temperatures.

Referring again briefly to FIG. 1, in light of the newly-introduced CTE/glass transition temperature notation, it may now be mentioned that layers 132 and 140 could he swapped; i.e., the layer 132 material may be chosen so as to have ideal $CTE_2$ for reflow temperature warpage reduction and the layer 140 material may he chosen so as to have ideal CTE for room temperature reduction.

Figure 3:
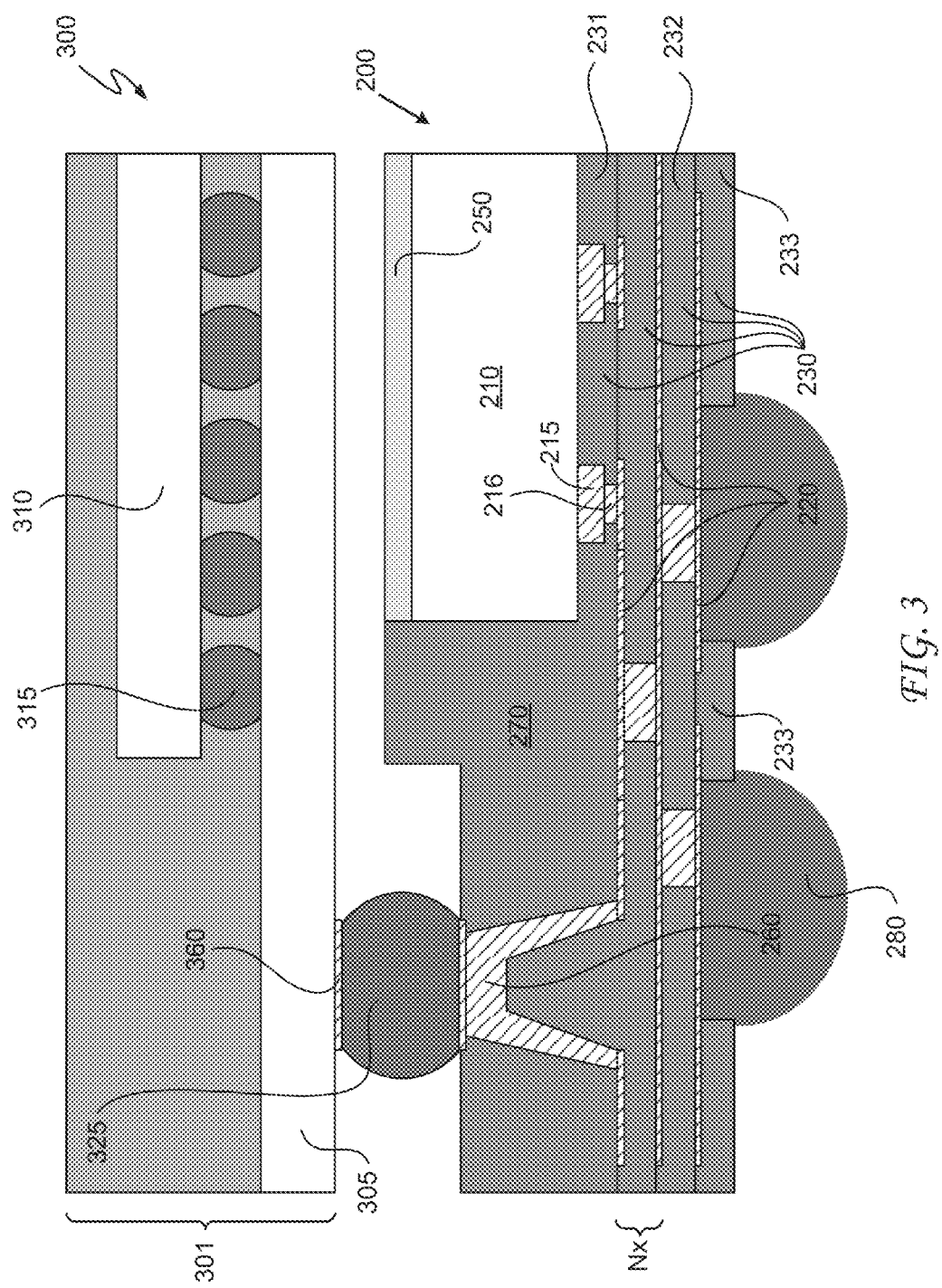
FIG. 3 is a cross-sectional view of a stacked microelectronic assembly according to an embodiment of the invention.

FIG. 3 is a cross-sectional view of a stacked microelectronic assembly 300 according to an embodiment of the invention. As illustrated in FIG. 3, stacked microelectronic assembly 300 comprises microelectronic package 200 (with features, components, and details as described above) and a microelectronic package 301 over microelectronic package 200. In one embodiment, then, stacked microelectronic assembly 300 is a PoP assembly. According to one embodiment, microelectronic package 301 includes one or more memory devices, in another embodiment, microelectronic package 301 comprises a wireless communications system (or, alternatively, includes one or more components of a communications system). In a further embodiment, microelectronic package 301 includes a graphics processing system. Stacked microelectronic assembly 300 may comprise part of any type of computing system, such as a hand-held computing system (e.g., a cell phone, smart phone, music player, etc.), mobile computing system (e.g., a laptop, nettop, tablet, etc.), a desktop computing system, or a server. In one embodiment, stacked microelectronic assembly 300 comprises a solid state drive (SSD).

Microelectronic package 301 may comprise any suitable package structure. In one embodiment, microelectronic package 301 comprises an integrated circuit (IC) die 310 (such as a memory die) disposed on a substrate 305, and electrically (and perhaps mechanically) coupled with the substrate by interconnects that can take one of the forms described below. In the illustrated embodiment, IC die 310 is disposed on substrate 305 in a flip-chip arrangement with solder bumps 315, and each of the interconnects may comprise an electrically conductive terminal on die 310 (e.g., a conductive pad, conductive bump, conductive pillar, or other structure or combination of structures) and a mating conductive terminal on substrate 305 (e.g., a conductive pad, conductive bump, conductive pillar, or other structure or combination of structures) that are electrically coupled by, for example, a solder reflow process. In another embodiment, IC die 310 may be electrically coupled with substrate 305 by one or more wirebonds (not shown), and a layer of die attach adhesive (also not shown) disposed between the die and the substrate may aid in mechanically securing the die to the substrate. In a further embodiment, two or more IC dies—one of which may be IC die 310—may be disposed above substrate 305, and each IC die may be electrically coupled with the substrate by the aforementioned flip-chip interconnects or by wirebonds, or by any suitable combination of these interconnect structures or other types of interconnects. In yet a further embodiment, one or more of the IC dies may be stacked over one of the other IC dies.

A plurality of interconnects 325 electrically couple microelectronic package 301 with microelectronic package 200. Each of the interconnects 325 may comprise any type of structure and material (or materials) capable of providing electrical communication between the upper and lower IC packages. According to one embodiment, an interconnect 325 comprises a reflowed solder hump extending between a terminal (e.g., PoP pad 260 or some other pad, hump, column, or pillar) on a surface of microelectronic package 200 and a mating terminal 360 (e.g., a pad, bump, column, or pillar) on a surface of microelectronic package 301. in one embodiment, the array of interconnects 325 also aid in mechanically securing microelectronic package 301 to microelectronic package 200. Of course, it should he understood that many other types of interconnects and materials are possible (e.g., wirebonds).

Figure 4:
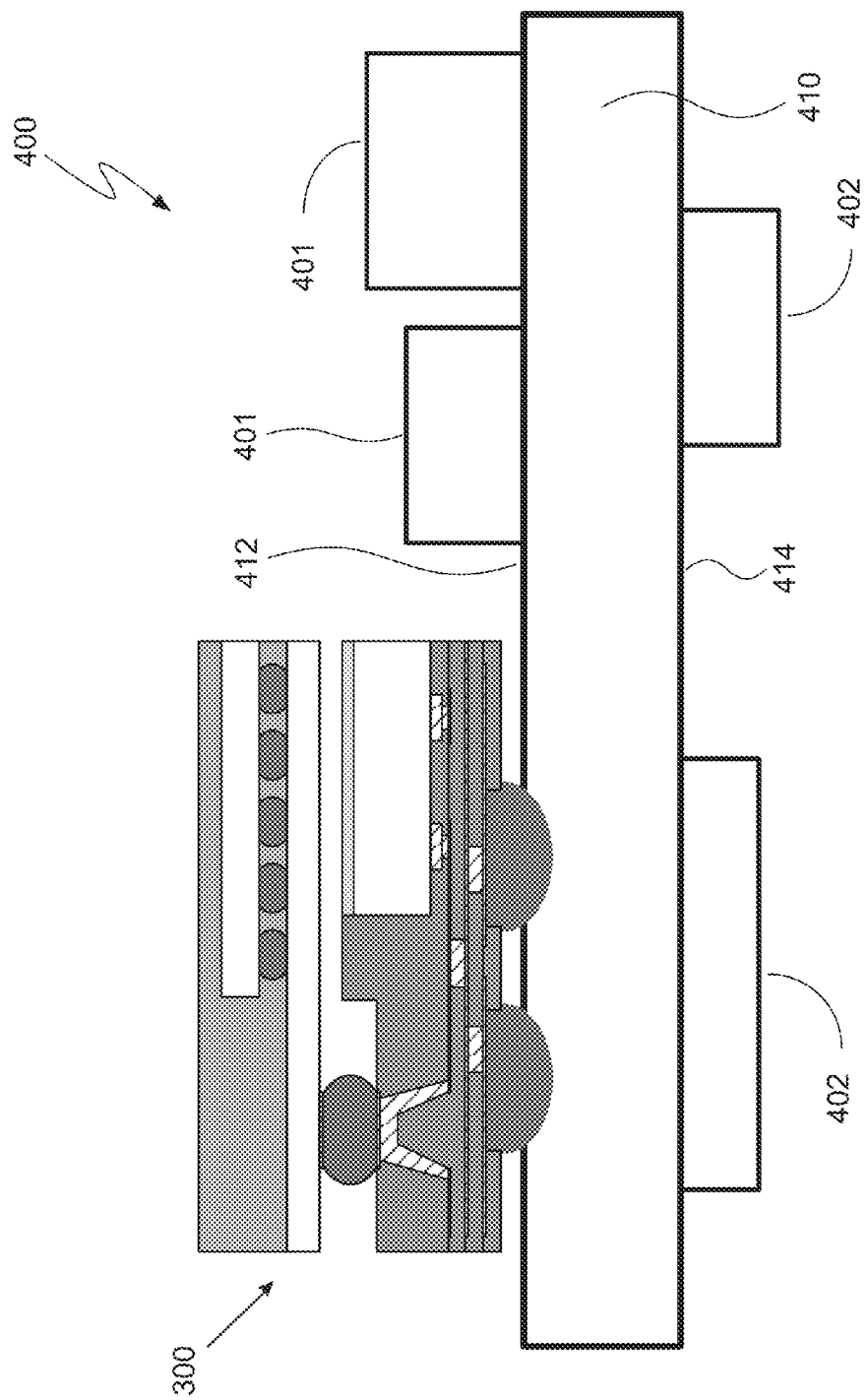
FIG. 4 is a cross-sectional view of a computing system according to an embodiment of the invention.

FIG. 4 is a cross-sectional view of a computing system 400 according to an embodiment of the invention. System 400 includes a number of components disposed on a circuit board, mainboard, or other board 410. Board 410 includes a first side 412 and an opposing second side 414, and various components may be disposed on either one or both of the first and second sides 412, 414. In the illustrated embodiment, the computing system 400 includes stacked microelectronic assembly 300 (with features, components, and details as described above) disposed on side 412. System 400 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Board 410 may comprise any suitable type of circuit board or other substrate capable of providing electrical communication between one or more of the various components disposed on the board. In one embodiment, for example, board 410 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with board 410. However, it should be understood that the disclosed embodiments are not limited to the above-described PCB and, further, that board 410 may comprise any other suitable substrate.

In addition to stacked microelectronic assembly 300, one or more additional components may be disposed on either one or both sides 412, 414 of board 410. By way of example, as shown in the figures, components 401 may be disposed on side 412 of board 410, and components 402 may be disposed on the board's opposing side 414. Additional components that may be disposed on board 410 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices. In one embodiment, computing system 400 includes a radiation shield. In a further embodiment, computing system 400 includes a cooling solution. In yet another embodiment, computing system 400 includes an antenna. In yet a further embodiment, system 400 may be disposed within a housing or case. Where board 410 is disposed within a housing, some of the components of computer system 400—e.g., a user interface device, such as a display or keypad, and/or a power supply, such as a battery—may be electrically coupled with board 410 (and/or a component disposed on this board) but may he mechanically coupled with the housing.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required. by the appended claims. For example, to one of ordinary skill in the art, it will be readily apparent that the microelectronic package and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A microelectronic package comprising:
a microelectronic die;
a plurality of electrically conductive layers;
a plurality of electrically insulating layers including:
a first electrically insulating layer closer to the microelectronic die than any other electrically insulating layer, the first electrically insulating layer having a first glass transition temperature, a first coefficient of thermal expansion, and a first modulus of elasticity;
a second electrically insulating layer having a second glass transition temperature, a second coefficient of thermal expansion, and a second modulus of elasticity, wherein the second modulus of elasticity is greater than the first modulus of elasticity; and
a third electrically insulating layer having a third glass transition temperature, a third coefficient of thermal expansion, and a third modulus of elasticity,
wherein:
the second coefficient of thermal expansion at a temperature less than the second glass transition temperature is less than the first coefficient of thermal expansion at a temperature less than the first glass transition temperature; and
the third coefficient of thermal expansion at a temperature greater than the third glass transition temperature is less than the first coefficient of thermal expansion at a temperature greater than the first glass transition temperature.

2. The microelectronic package of claim 1 wherein:
the second electrically insulating layer is farther from the microelectronic die than any other electrically insulating layer other than the third electrically insulating layer.

3. The microelectronic package of claim 2 wherein:
the third electrically insulating layer constitutes an outermost layer of the microelectronic package.

4. The microelectronic package of claim 3 wherein:
the second electrically insulating layer and the third electrically insulating layer each comprise a glass cloth material.

5. The microelectronic package of claim 1 wherein:
the third electrically insulating layer is farther from the microelectronic die than any other electrically insulating layer other than the second electrically insulating layer.

6. The microelectronic package of claim 5 wherein:
the second electrically insulating layer constitutes an outermost layer of the microelectronic package.

7. The microelectronic package of claim 6 wherein:
the second electrically insulating layer comprises one of a glass cloth, a cyanate-based resin, a mold compound, and a filled epoxy; and
the third electrically insulating layer comprises a glass cloth.

8. A stacked microelectronic assembly comprising:
a first microelectronic package; and
a second microelectronic package over the first microelectronic package, wherein the first microelectronic package comprises:
a microelectronic die;
a plurality of electrically conductive layers; and
a plurality of electrically insulating layers including:
a first electrically insulating layer closer to the microelectronic die than any other electrically insulating layer, the first electrically insulating layer having a first glass transition temperature, a first coefficient of thermal expansion, and a first modulus of elasticity;
a second electrically insulating layer having a second glass transition temperature, a second coefficient of thermal expansion, and a second modulus of elasticity, wherein the second modulus of elasticity is greater than the first modulus of elasticity; and
a third electrically insulating layer having a third glass transition temperature, a third coefficient of thermal expansion, and a third modulus of elasticity,
wherein:
the second coefficient of thermal expansion at a temperature less than the second glass transition temperature is less than the first coefficient of thermal expansion at a temperature less than the first glass transition temperature; and the third coefficient of thermal expansion at a temperature greater than the third glass transition temperature is less than the first coefficient of thermal expansion at a temperature greater than the first glass transition temperature.

9. The stacked microelectronic assembly of claim 8 wherein:

the second electrically insulating layer is farther from the die than any other electrically insulating layer other than the third electrically insulating layer; and the third electrically insulating layer constitutes an outermost layer of the microelectronic package.

10. The stacked microelectronic assembly of claim 8 wherein:

the third electrically insulating layer is farther from the microelectronic die than any other electrically insulating layer other than the second electrically insulating layer; and the second electrically insulating layer constitutes an outermost layer of the microelectronic package.

11. The stacked microelectronic assembly of claim 10 wherein:

the second electrically insulating layer comprises one of a glass cloth, a cyanate-based resin, a mold compound, and a filled epoxy; and.

the third electrically insulating layer comprises a glass cloth.

12. A computing system comprising:

a board; and a stacked microelectronic assembly attached to the board, wherein the stacked microelectronic assembly comprises a first package and a second package over the first package, and wherein the first package comprises:

a microelectronic die;

a plurality of electrically conductive layers; and a plurality of electrically insulating layers including:

a first electrically insulating layer closer to the microelectronic die than any other electrically insulating layer, the first electrically insulating layer having a first glass transition temperature, a first coefficient of thermal expansion, and a first modulus of elasticity;

a second electrically insulating layer having a second glass transition temperature, a second coefficient of thermal expansion, and a second modulus of elasticity, wherein the second modulus of elasticity is greater than the first modulus of elasticity; and a third electrically insulating layer having a third glass transition temperature, a third coefficient of thermal expansion, and a third modulus of elasticity, wherein:

the second coefficient of thermal expansion at a temperature less than the second glass transition temperature is less than the first coefficient of thermal expansion at a temperature less than the first glass transition temperature; and the third coefficient of thermal expansion at a temperature greater than the third glass transition temperature is less than the first coefficient of thermal expansion at a temperature greater than the first glass transition temperature.

13. The computing system of claim 12 wherein:

the second electrically insulating layer is farther from the microelectronic die than any other electrically insulating layer other than the third electrically insulating layer; and the third electrically insulating layer constitutes an outermost layer of the microelectronic package.

14. The computing system of claim 12 wherein:

the third electrically insulating layer is farther from the microelectronic die than any other electrically insulating layer other than the second electrically insulating layer; and the second electrically insulating layer constitutes an outermost layer of the microelectronic package.

15. The computing system of claim 14 wherein:

the second electrically insulating layer comprises one of a glass cloth, a cyanate-based resin, a mold compound, and a filled epoxy; and the third electrically insulating layer comprises a glass cloth.

* * * * *